United States Patent
Bae et al.

(10) Patent No.: US 8,161,331 B2
(45) Date of Patent: Apr. 17, 2012

(54) DATA TRAINING SYSTEM AND METHOD THEREOF

(75) Inventors: Seung-jun Bae, Daejon (KR); Seong-jin Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1169 days.

(21) Appl. No.: 11/987,611

(22) Filed: Dec. 3, 2007

(65) Prior Publication Data

US 2008/0130986 A1 Jun. 5, 2008

(30) Foreign Application Priority Data

Dec. 4, 2006 (KR) .................. 10-2006-0121798

(51) Int. Cl.
*G06K 5/04* (2006.01)
*G11B 20/20* (2006.01)
(52) U.S. Cl. ...................................... 714/700
(58) Field of Classification Search .................. 714/700, 714/763, 815
See application file for complete search history.

(56) References Cited

U.S. PATENT DOCUMENTS

| | | | | |
|---|---|---|---|---|
| 6,678,852 B2* | 1/2004 | Tsuto | ............................ | 714/738 |
| 7,562,285 B2* | 7/2009 | Yang et al. | .................... | 714/815 |
| 7,643,602 B2* | 1/2010 | Miller et al. | .................. | 375/376 |
| 7,761,771 B2* | 7/2010 | Gower et al. | ................. | 714/763 |
| 7,831,882 B2* | 11/2010 | Tsern et al. | .................... | 714/751 |
| 2005/0010834 A1* | 1/2005 | Chu | .............................. | 713/600 |
| 2006/0075311 A1 | 4/2006 | Ranjan et al. | | |

FOREIGN PATENT DOCUMENTS

| | | |
|---|---|---|
| JP | 11-284687 | 10/1999 |
| JP | 2004-213438 | 7/2004 |
| KR | 10-2000-0071660 | 11/2000 |
| KR | 10-2006-0025350 | 3/2006 |
| KR | 10-2006-0026661 | 3/2006 |

OTHER PUBLICATIONS

Korean Office Action dated Jan. 29, 2008 corresponding to Korean Application Nos. 10-2006-0025350, 10-2006-0026661, and 10-2000-0071660.

* cited by examiner

*Primary Examiner* — James C Kerveros

(74) *Attorney, Agent, or Firm* — Harness, Dickey & Pierce, P.L.C.

(57) ABSTRACT

A data training system and method thereof are provided. The example data training system may include a memory controller transmitting a given data pattern to a memory device, the memory controller first determining whether an error is present within the transmitted data pattern based on at least one error detection code, the at least one error detection code based on at least one of the given data pattern and the transmitted data pattern and second determining a data delay time for reducing an amount of skew based on whether the first determining step determines an error to be present within the transmitted data pattern.

28 Claims, 11 Drawing Sheets

DATA TRAINING SYSTEM AND METHOD THEREOF

PRIORITY STATEMENT

This application claims the benefit of Korean Patent Application No. 10-2006-0121798, filed on Dec. 4, 2006, in the Korean Intellectual Property Office, the disclosure of which is incorporated herein in its entirety by reference.

BACKGROUND

1. Field

Example embodiments relate generally to a data training system and method thereof.

2. Description

Data training may regulate skew generated during a read operation reading data from a memory device (e.g., a dynamic random access memory (DRAM)) and/or during a write operation writing data to the memory device. Data training may test a memory device with a memory controller by applying a given data pattern to the memory device and regulating the skew of each data pin based on a data pattern received back from the memory device.

FIG. 1 is a flowchart illustrating a conventional data training process.

Referring to FIG. 1, a data pin for executing data training may be selected (at S1000). A delay time i of a record data pattern may be initialized (e.g., to a minimum value) (at S1010). The given data pattern may be recorded or written in a memory cell and the recorded data pattern may then be read from the memory cell (at S1020). Next, the recorded data pattern and the read data pattern may be compared to determine whether the compared data patterns are the same (at S1030).

If the compared data patterns are determined to be the same, i may be incremented by one (e.g., or another value corresponding to 1/N of a clock cycle of a given clock signal) (at S1040) and the process returns to S1020. Otherwise, if the compared data patterns are determined not to be the same, the current delay time t_err (e.g., the value of i when the inequality is determined) may be stored (at S1050). Next, the delay time i may be compared with a threshold delay time t_max (at S1060). In an example, the threshold time t_max may correspond to a clock cycle of a given clock signal.

Referring to FIG. 1, if the delay time i is determined to be less than the threshold delay time t_max, the delay time i may be incremented (at S1040) and the process may return to S1020. Otherwise, if the delay time i is determined not to be less than the threshold delay time t_max, a given data delay time for reducing skew may be determined (at S1070) based on the delay time t_err. The process of FIG. 1 may then determine whether the above-described process has been applied to each data pin (at S1080). If at least one data pin is determined not to have been tested (e.g., to determine a sufficient delay time to reduce skew) (in S1080), one of the non-tested data pins may be selected (at S1090) and the process returns to step S1010. Otherwise, If each data pin is determined to have been tested, the process of FIG. 1 may terminate.

Accordingly, the difference between skews of each data pin may be estimated. A time margin of the data and the clock signal may be increased by the controller setting the delay time which may reduce the skews of each data pin, which likewise may reduce an occurrence of data errors.

However, the conventional process of FIG. 1 may not applied if data is already present in an entirety of a given memory cell (e.g., because the test pattern would otherwise overwrite the data). Also, the conventional process of FIG. 1 may consume a relatively large amount of time to perform. Further, the complexity of the conventional process of FIG. 1 may increase as the number of functions of the controller increases. Also, the conventional process of FIG. 1 may not allow a memory device to directly detect a data error, and the size of the memory device performing the conventional process of FIG. 1 may increase if a resistor for separate data training is used.

SUMMARY OF EXAMPLE EMBODIMENTS

An example embodiment is directed to a method of training data, including transmitting a given data pattern to a memory device, first determining whether an error is present within the transmitted data pattern based on at least one error detection code, the at least one error detection code based on at least one of the given data pattern and the transmitted data pattern and second determining a data delay time for reducing an amount of skew based on whether the first determining step determines an error to be present within the transmitted data pattern.

Another example embodiment is directed to a data training system, including a memory controller transmitting a given data pattern to a memory device, the memory controller first determining whether an error is present within the transmitted data pattern based on at least one error detection code, the at least one error detection code based on at least one of the given data pattern and the transmitted data pattern and second determining a data delay time for reducing an amount of skew based on whether the first determining step determines an error to be present within the transmitted data pattern.

Another example embodiment is directed to a method of data training which may detect the amount of skew of a data pin only via recording operations and may determine a suitable data delay time by performing data training using an error detection code (EDC) used in a next-generation dynamic random access memory (DRAM), and a system adapted to the same.

Another example embodiment is directed to a method of data training which may calculate error occurrence frequency using an EDC used in next-generation DRAM and may adjust a time period allocated to data training based on the error occurrence frequency, and a system adapted to the same.

BRIEF DESCRIPTION OF THE DRAWINGS

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

DETAILED DESCRIPTION OF EXAMPLE EMBODIMENTS

Figure 1:
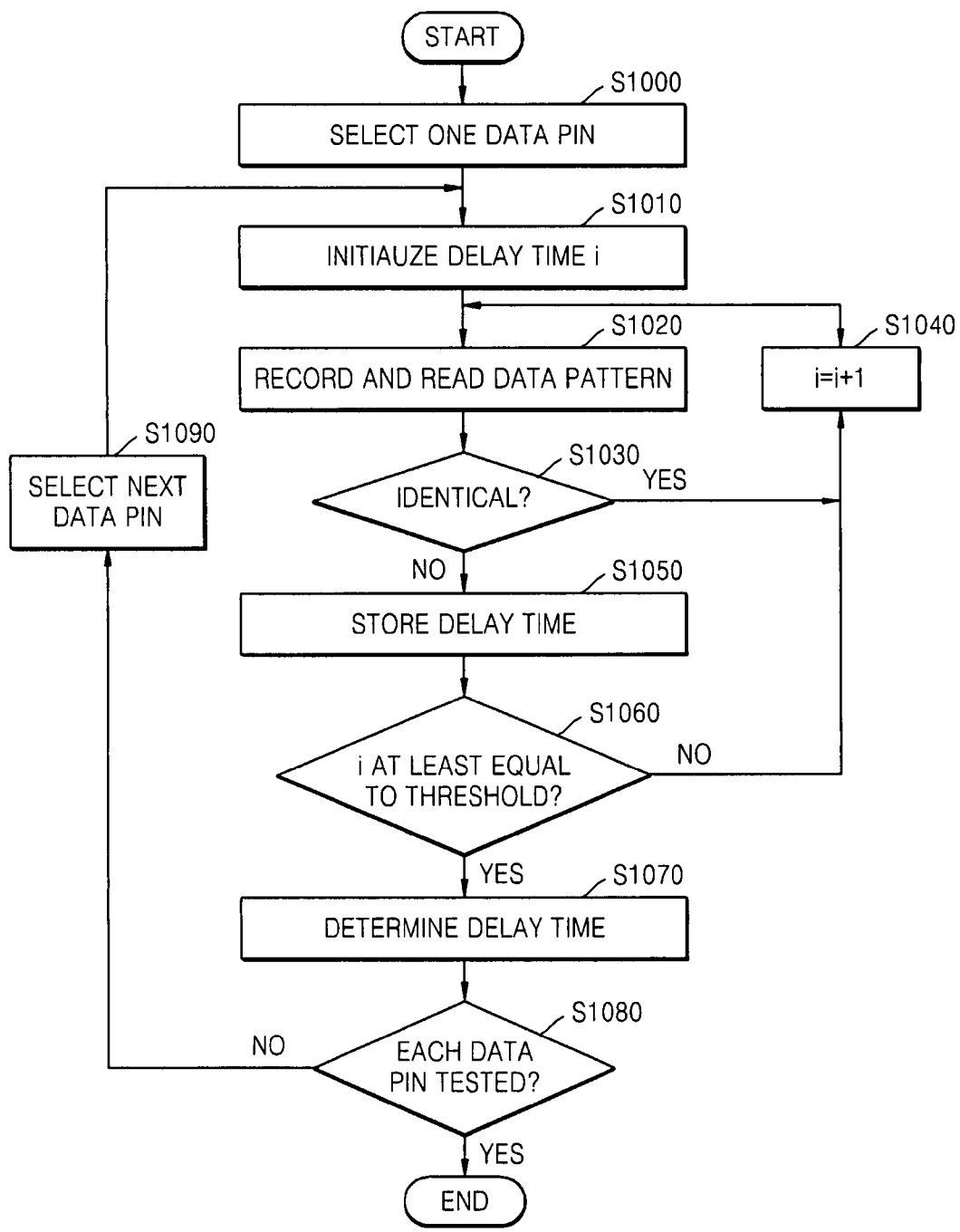
FIG. 1 is a flowchart illustrating a conventional data training process.

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

Accordingly, while example embodiments are susceptible to various modifications and alternative forms, specific embodiments thereof are shown by way of example in the drawings and will herein be described in detail. It should be understood, however, that there is no intent to limit example embodiments to the particular forms disclosed, but conversely, example embodiments are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
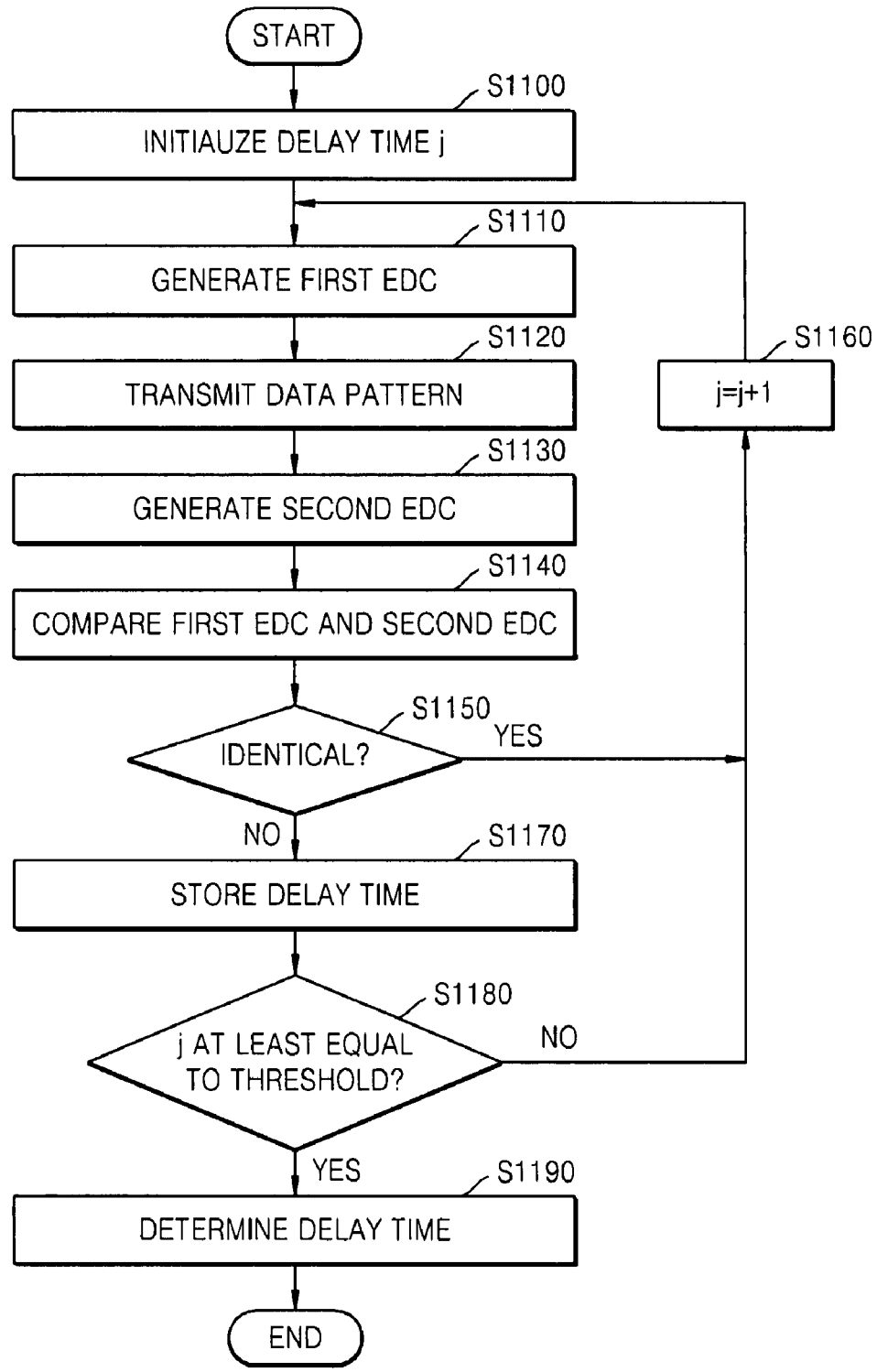
FIG. 2 is a flowchart illustrating a data training process according to an example embodiment.

FIG. 2 is a flowchart illustrating a data training process according to an example embodiment.

In the example embodiment of FIG. 2, a given data pin among a plurality of data pins may be selected for data training (not shown). Data delay time may be initialized (at S1100). For example, the delay time $t\_min$ may be initialized to 0. In an example, the data delay time j may be regulated via a buffer controlled by a control signal. A first error detection code (EDC) may be generated (at S1110) based on a given data pattern. In an example, the given data pattern may correspond to a data pattern that has not yet been transmitted to a memory device. In another example, the first EDC may be a cyclic redundancy check (CRC) code used in a CRC process. CRC processes are well known in the art and will not be discussed further for the sake of brevity. Examples of generating the first EDC as a CRC code are provided below.

In the example embodiment of FIG. 2, the given data pattern may be transmitted (e.g., written/recorded) to the memory device (at S1120) via the selected data pin. The memory device may generate a second EDC (at S1130) based on the transmitted data pattern. In an example, the second EDC may be a CRC code. In an example, the transmitted data pattern may be controlled so as not to be stored in a memory cell included inside the memory device.

In the example embodiment of FIG. 2, the first EDC and the second EDC may be compared (at S1140) in order to determine whether the compared EDCs are the same (at S1150). If the first EDC and the second EDC are determined to be the same (at S1150), the data delay time j may be incremented (e.g., by one) (at S1160), and the process may return to S1110. Otherwise, if the first EDC and the second EDC are determined not to be the same (at S1150), a delay time $t\_err$ may be stored (at S1170). In an example, the delay time $t\_err$ may correspond to a delay time when an error is expected to have occurred based on the comparison of S1140 indicating an inequality, for example, due to skew.

In the example embodiment of FIG. 2, the data delay time j may be compared to a threshold delay time $t\_max$ (at S1180) (e.g., to determine whether S1110 through S1150 have been performed a given number of times). In an example, the threshold delay time $t\_max$ may be determined by a user. In another example, the difference between the delay time $t\_min$ and the threshold delay time $t\_max$ may be equal to a cycle of a given clock signal.

In the example embodiment of FIG. 2, if the data delay time j is not determined to be at least equal to the threshold delay time $t\_max$ (at S1180), the data delay time j may be incremented (at S1160) and the process may return to S1110. Otherwise, if the data delay time j is determined to be at least equal to the threshold delay time $t\_max$ (at S1180), a given delay time $t\_opt$ may be determined (at S1190) so as to reduce the skew based on the stored delay time $t\_err$. Then, the given delay time $t\_opt$ may be set as a basic setting value of the selected data pin. In an example, the given delay time $t\_opt$ may correspond to a time in which a time margin between each data and the clock signal may be higher (e.g., maximized or highest).

Figure 3:
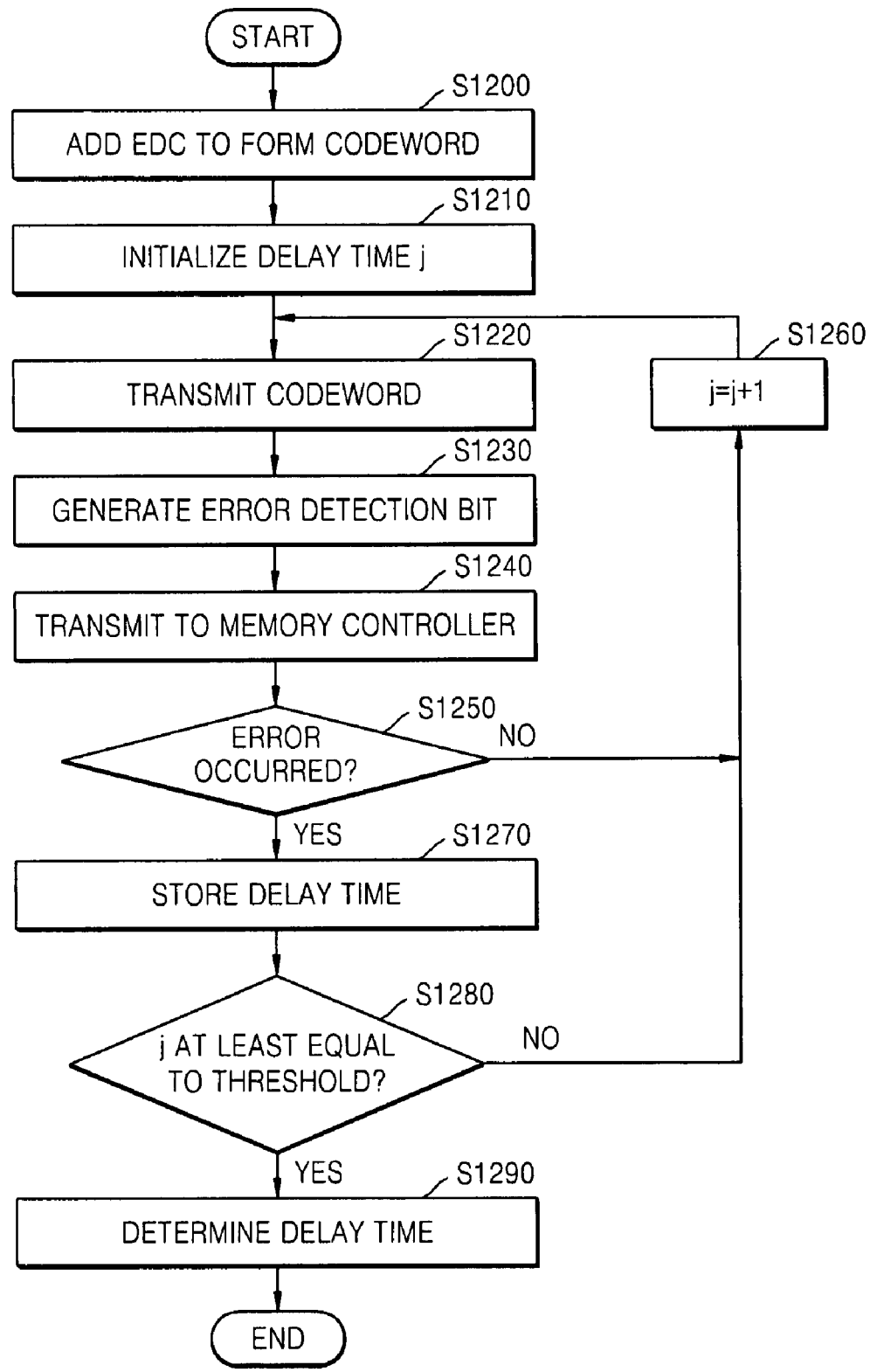
FIG. 3 is a flowchart illustrating another data training process according to another example embodiment.

FIG. 3 is a flowchart illustrating another data training process according to another example embodiment.

In the example embodiment of FIG. 3, a given data pin among a plurality of data pins may be selected for data training (not shown, see description of FIG. 2). Then, an EDC may be generated from a given data pattern (not shown, see FIG. 2). An EDC may be added to the given data pattern (at S1200). In an example, the EDC may correspond to a CRC code. An example CRC code generation process will now be described in greater detail.

In example CRC code generation, a generator polynomial G(x) may be selected. For example, the generator polynomial G(x) may be selected from CRC-16, CRC-CCITT, and CRC-32, which are well-known CRC standards. A polynomial M(x) may be generated by multiplying a number of CRC code bits with the given data pattern. The generated polynomial M(x) may be divided into the selected generator polynomial G(x), and the result may be the CRC code.

Returning to the example embodiment of FIG. 3, a data delay time j may be initialized (at S1210). For example, the delay time t_min may be initialized to 0. In an example, the data delay time j may be regulated via a buffer controlled by a control signal.

In the example embodiment of FIG. 3, a data pattern (hereinafter, referred to as a "codeword") including the EDC may be transmitted to the memory device (at S1220) via the selected data pin. The memory device may generate a syndrome from the transmitted codeword. The syndrome may be a value obtained if the codeword is divided by the generator polynomial G(x). If the syndrome equals 0, an error may be determined not to have occurred. Otherwise, if the syndrome is not 0, an error may be determined to have occurred. Accordingly, an error correction bit, based on the syndrome, may be generated (at S1230) to indicate whether an error has occurred. In an example, the error correction bit may be embodied as a single bit.

In the example embodiment of FIG. 3, the generated error detection bit may be transmitted to a memory controller (at S1240). The memory controller may determine that an error has occurred via the transmitted error detection bit (at S1250). If no error is determined to have occurred (at S1250), the data delay time j may be incremented (e.g., by one) (at S1260), and the process may then return to S1220. Otherwise, if an error is determined to have occurred (at S1250), the delay time t_err of the time (e.g., j value) corresponding to when the detected error is expected to have occurred may be stored (at S1270). In an example, the detected error may be indicative of skew during the codeword transmission.

In the example embodiment of FIG. 3, it is determined whether the data delay time j is at least equal to a threshold delay time t_max (at S1280) (e.g., to determine whether S1220 through S1270 have been performed a given number of times). In an example, the threshold delay time t_max may be determined by a user. In another example, the difference between the delay time t_min and the threshold delay time t_max may be equal to a cycle of a given clock signal.

In the example embodiment of FIG. 3, if the data delay time j is not determined to be at least equal to the threshold delay time t_max (at S1280), the data delay time j may be incremented (at S1260) and the process may return to S1220. Otherwise, if the data delay time j is determined to be at least equal to the threshold delay time t_max (at S1280), a given delay time t_opt may be determined (at S1290) so as to reduce the skew based on the stored delay time t_err. Then, the given delay time t_opt may be set as a basic setting value of the selected data pin. In an example, the given delay time t_opt may correspond to a time in which a time margin between each data and the clock signal may be higher (e.g., maximized or highest).

Figure 4:
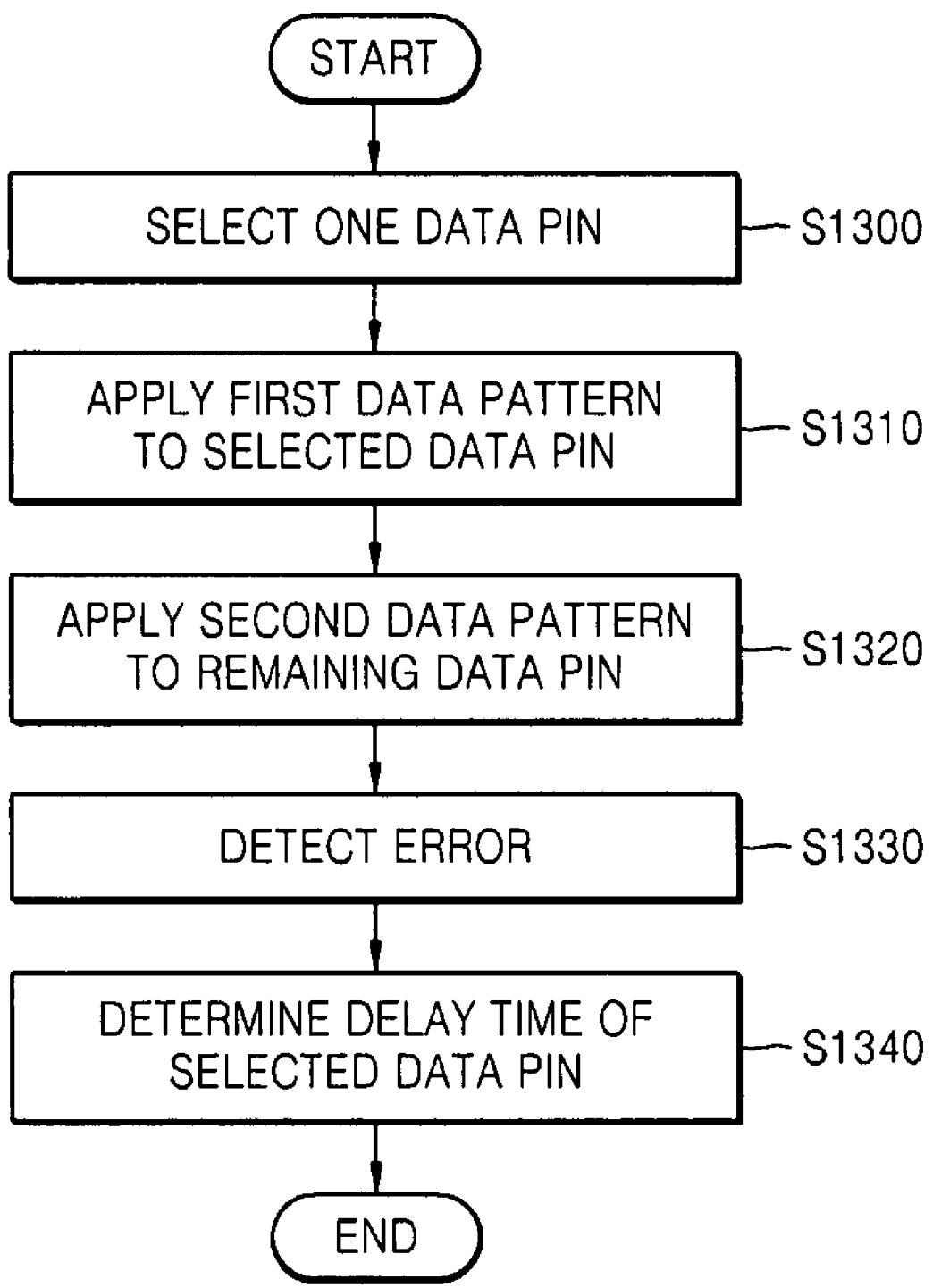
FIG. 4 is a flowchart illustrating another data training process according to another example embodiment.

FIG. 4 is a flowchart illustrating another data training process according to another example embodiment.

In the example embodiment of FIG. 4, a data pin on which to perform data training may be selected (at S1300). A first data pattern may be applied to the selected data pin (at S1310). In an example, the first data pattern may be an alternating current (AC) data pattern. The AC data pattern may correspond to a data pattern in which "toggling" occurs (e.g., shifting back and forth between a first logic level such as a logic "1" and a second logic level such as a logic "0"). Also, the AC data pattern may correspond to a data pattern in which a distortion or a delay may occur during transmission.

In the example embodiment of FIG. 4, a second data pattern may be applied to the remaining data pins (e.g., other than the selected data pin) (at S1320). In an example, the second data pattern may correspond to a direct current (DC) data pattern. The DC data pattern may correspond to a data pattern in which "toggling" does not occur (e.g., because the DC voltage level may remain substantially the same, or at the same logic level, such as a logic "1"). Also, the DC data pattern may correspond to a data pattern in which a distortion or a delay may not occur during transmission. For example, the DC data pattern may correspond to a data pattern in which the first logic level (e.g., a higher logic level or logic "1") or the second logic level (e.g., a lower logic level or logic "0") may be maintained.

In the example embodiment of FIG. 4, a determination may be made regarding whether an error is present (at S1330). For example, the error detection may be performed by a memory controller and a memory device each generating first and second EDCs and comparing the generated EDCs (e.g., see FIG. 2), or alternatively by a memory device generating an error detection bit and transmitting the error detection bit to a memory controller (e.g., see FIG. 3). As discussed above, an error may not occur while transmitting the DC data pattern (e.g., because the same logic level may be maintained). Accordingly, if an error occurs, an assumption may be made that the error may be related to the AC data pattern. Therefore, the data delay time of the selected data pin may be determined (at S1340) based on an error occurrence time, in order to perform data training on the selected data pin. Accordingly, it will be appreciated that data training may be performed on serial data, in contrast to a conventional EDC circuit which may only detect errors in parallel bit data.

Figure 5:
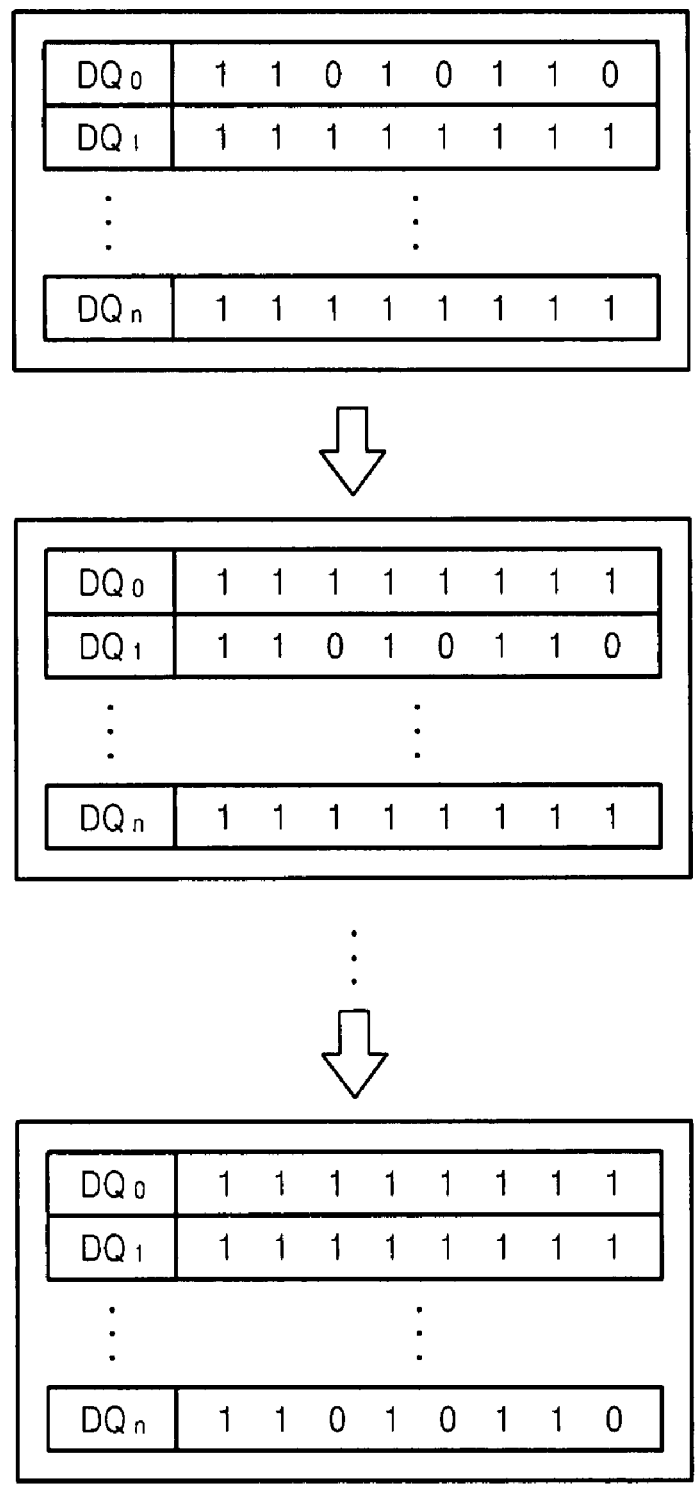
FIG. 5 illustrates a data pattern applied to a plurality of data pins according to an example embodiment.

FIG. 5 illustrates a data pattern applied to a plurality of data pins according to an example embodiment.

In the example embodiment of FIG. 5, a first data pin $DQ_0$ may be selected for data training. An AC data pattern may be applied to the first data pin $DQ_0$. For example, the AC data pattern may be a "random" data pattern set by a user. A DC data pattern may be applied to remaining data pins $DQ_1$ through $DQ_n$. In an example, as shown in FIG. 5, the DC data pattern may be a data pattern corresponding to the first logic level (e.g., a higher logic level or logic "1").

In the example embodiment of FIG. 5, if the data training on the first data pin $DQ_0$ completes, the AC data pattern may be applied to a second data pin $DQ_1$, and so on. Accordingly, the DC data pattern may subsequently be applied to the remaining data pins $DQ_2$ through $DQ_n$. It will be appreciated that data training may be performed for each of the data pins $DQ_0$ through $DQ_n$ in this manner.

Figure 6A:
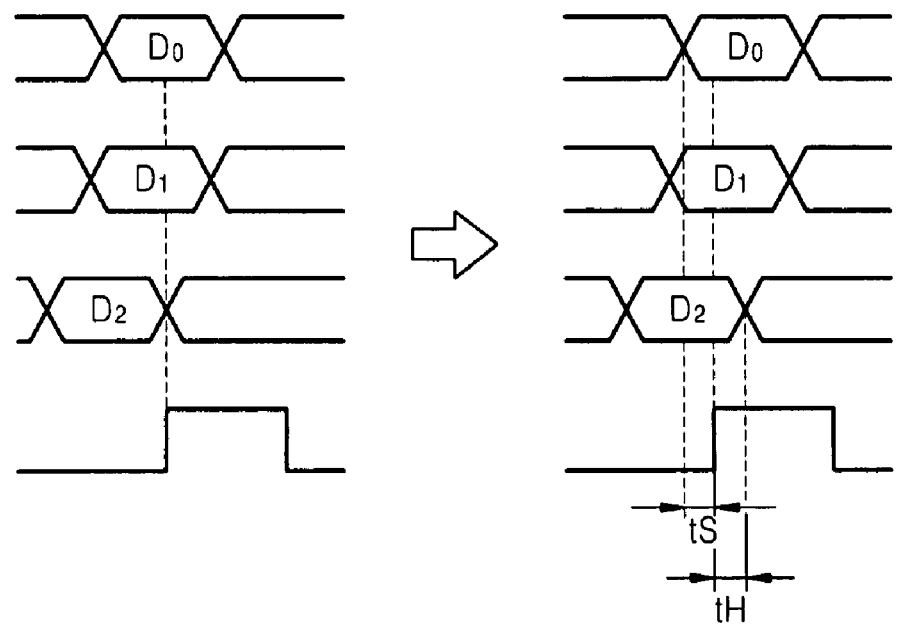
FIG. 6A is a timing diagram illustrating data training performed on a plurality of data pins according to an example embodiment.

FIG. 6A is a timing diagram illustrating data training performed on a plurality of data pins according to an example embodiment.

Figure 6B:
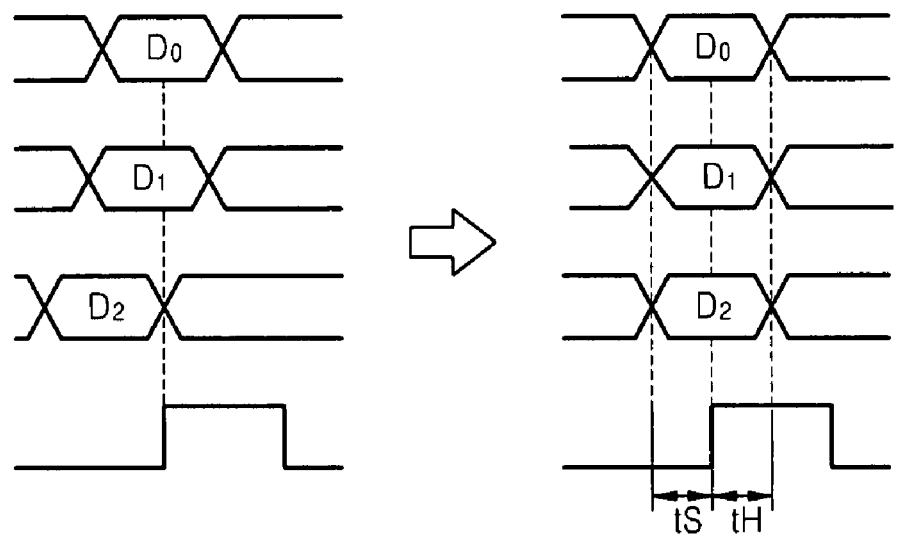
FIG. 6B is a timing diagram illustrating data training performed a plurality of data pins according to another example embodiment.

FIG. 6B is a timing diagram illustrating data training performed a plurality of data pins according to another example embodiment.

In the example embodiments of FIGS. 6A and 6B, skew may occur if data is transmitted (e.g., via a data bus, etc.). The degree of skew may differ based on a condition of a transmission line upon which the data is being transmitted. Accordingly, even if a memory controller concurrently outputs data via the plurality of data pins, the time at which the data may be input to a data pin of a memory device may be different due to skew incurred from the data line.

In the example embodiment of FIG. 6A, in the "left" portion, if valid data is not present in a rising edge of a clock signal due to the skew (e.g., the data signal is in a metastable state, etc.), the memory device may be unable to read the data. In another example, the memory device may also be unable to read the data if margins of setup time tS and hold time tH are relatively small.

In the example embodiment of FIG. 6A, in the "right" portion, an equal delay time may be set for each data pins, and the data may be read. However, in this example, the margins of the setup time tS and the hold time tH may decrease, and an error may occur.

In the example embodiment of FIG. 6B, in the "right" portion, if different delay times are set for each data pin, each input data may be arranged on the rising edge of the clock signal. In this example, the margins of the setup time tS and the hold time tH may be increased (e.g., maximized). Accordingly, if the delay time is configured separately for each data pin, an occurrence of errors may decrease.

Figure 7:
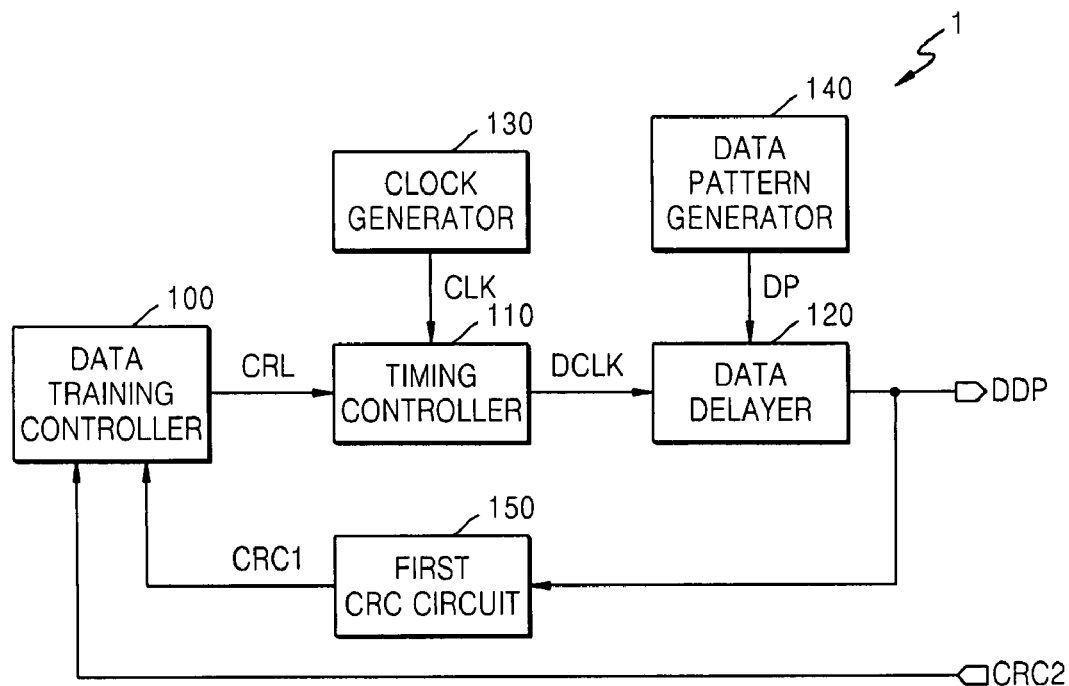
FIG. 7 is a block diagram illustrating a memory controller according to an example embodiment.

FIG. 7 is a block diagram illustrating a memory controller 1 according to an example embodiment.

In the example embodiment of FIG. 7, the memory controller 1 may include a data training controller 100, a timing controller 110, a data delayer 120, a clock generator 130, a data pattern generator 140, and a first CRC circuit 150.

The data training controller 100 may generate a given control signal CRL and may output the control signal CRL to the timing controller 110. The timing controller 110 may receive the control signal CRL and a clock signal CLK and may generate a delayed clock signal DCLK in response to the control signal CRL.

In the example embodiment of FIG. 7, the data delayer 120 may receive a given data pattern DP and the delayed clock signal DCLK and may output the data pattern DP after synchronizing the data pattern DP with the delayed clock signal DCLK in order to generate a delayed data pattern DDP. Delay time of the delayed data pattern DDP may be controlled by the data training controller 100, and a default may be set to 0.

In the example embodiment of FIG. 7, the first CRC circuit 150 may receive the delayed data pattern DDP and may generate a first CRC code from the received delayed data pattern DDP. An example process for generating the first CRC code has been described above. The data delayer 120 may transmit the delayed data pattern DDP to a memory device (not shown) via a data pin (not shown). The memory device may receive the delayed data pattern DDP from the memory controller 1 and may generate a second CRC code from the transmitted delayed data pattern DDP. The memory device may transmit the second CRC code to the memory controller 1. The memory controller 1 may output a control signal (not shown) such that the delayed data pattern DDP transmitted to the memory device need not be stored in a memory cell included inside the memory device. Accordingly, in an example, the data training may be performed without having to store data in a memory cell of the memory device. For example, this may allow data training to be performed even if a given memory cell is "full" because data stored therein need not be overwritten.

In the example embodiment of FIG. 7, the data training controller 100 may receive and compare the first CRC code and the second CRC code. For example, the data training controller 100 may include a comparator (not shown) for performing the comparison. The data training controller 100 may store a delay time or times indicating when the first CRC code and the second CRC codes are determined to be the same. The data training controller 100 may increment a unit delay of the delayed data pattern DDP a given number of times until a threshold set time t_set is reached. For each iterative increment, the data training controller 100 may determine whether the first CRC code and the second CRC code are the same (e.g., with the comparator (not shown)).

In the example embodiment of FIG. 7, if the delayed time reaches the set time t_set, the data training controller 100 may stop generating the control signal and may determine a given delay time t_opt based on the stored delay time t_err.

Figure 8:
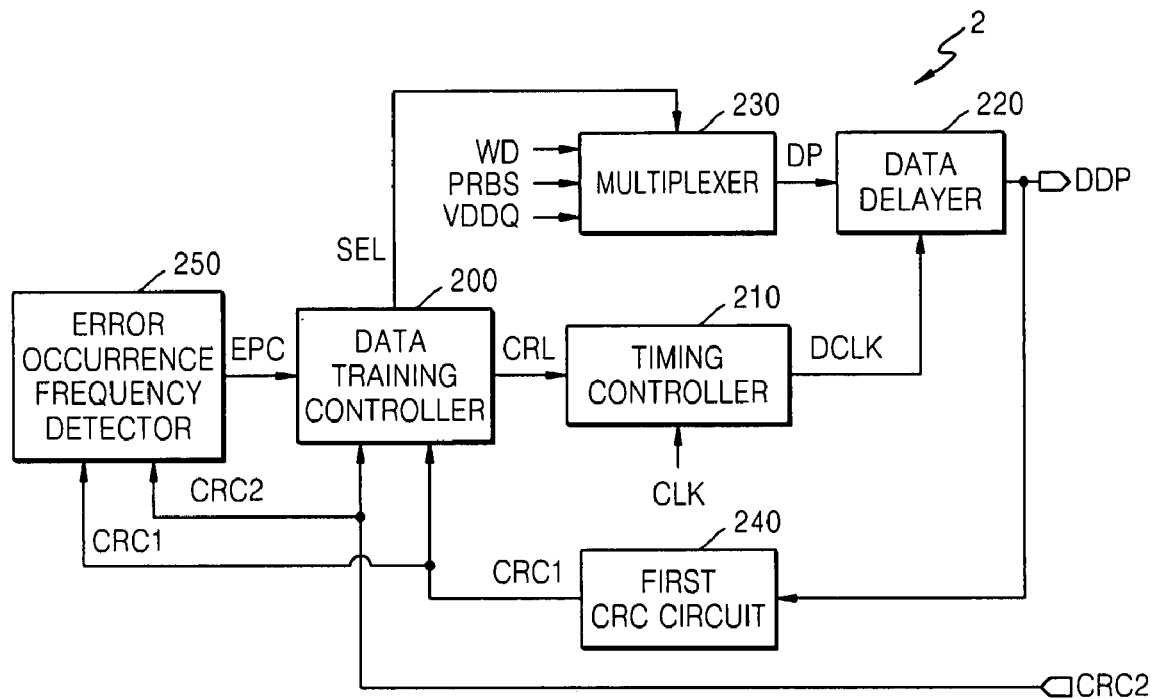
FIG. 8 is a block diagram illustrating another memory controller according to another example embodiment.

FIG. 8 is a block diagram illustrating a memory controller 2 according to another example embodiment.

In the example embodiment of FIG. 8, the memory controller 2 may include a data training controller 200, a timing controller 210, a data delayer 220, a multiplexer 230, a first CRC circuit 240, and an error occurrence frequency detector 250. The multiplexer 230 may receive record data WD, an AC data pattern PRBS, and a DC data pattern VDDQ, and may output one of the record data WD, the AC data pattern PRBS, and the DC data pattern VDDQ in response to a selection signal SEL outputted from the data training controller 200.

In a normal mode, the data training controller 200 may output a selection signal SEL for selecting the record data WD. In a data training mode, the data training controller 200 may output a selection signal SEL for selecting one of the AC data pattern PRBS and the DC data pattern VDDQ.

In the example embodiment of FIG. 8, in the data training mode, the data delayer 220 may delay and output one of the AC data pattern PRBS and the DC data pattern VDDQ for a given amount of time in response to a delayed clock signal DCLK outputted from the timing controller 210. The error occurrence frequency detector 250 may receive a first CRC code from the first CRC circuit 240 included inside the memory controller 2 and may receive a second CRC code from a second CRC circuit (not shown) included inside a memory device (not shown). The error occurrence frequency detector 250 may determine whether the first CRC code and the second CRC code are the same and may detect an error occurrence frequency based on the result of the comparison. For example, the error occurrence frequency detector 250 may include a comparator (not shown) for performing the comparison.

In the example embodiment of FIG. 8, the error occurrence frequency detector 250 may increase or extend a data training performance period if the error occurrence frequency is equal to or greater than a given threshold value, and may alternatively decrease the data training performance period if the error occurrence frequency is lower than the given threshold value. Accordingly, the data training performance period may be adaptively determined based on how effective the data training is reducing errors. For example, the error occurrence frequency detector 250 may output a control signal EPC for changing a set value of a resistor (not shown) related to the data training performance period.

Figure 9:
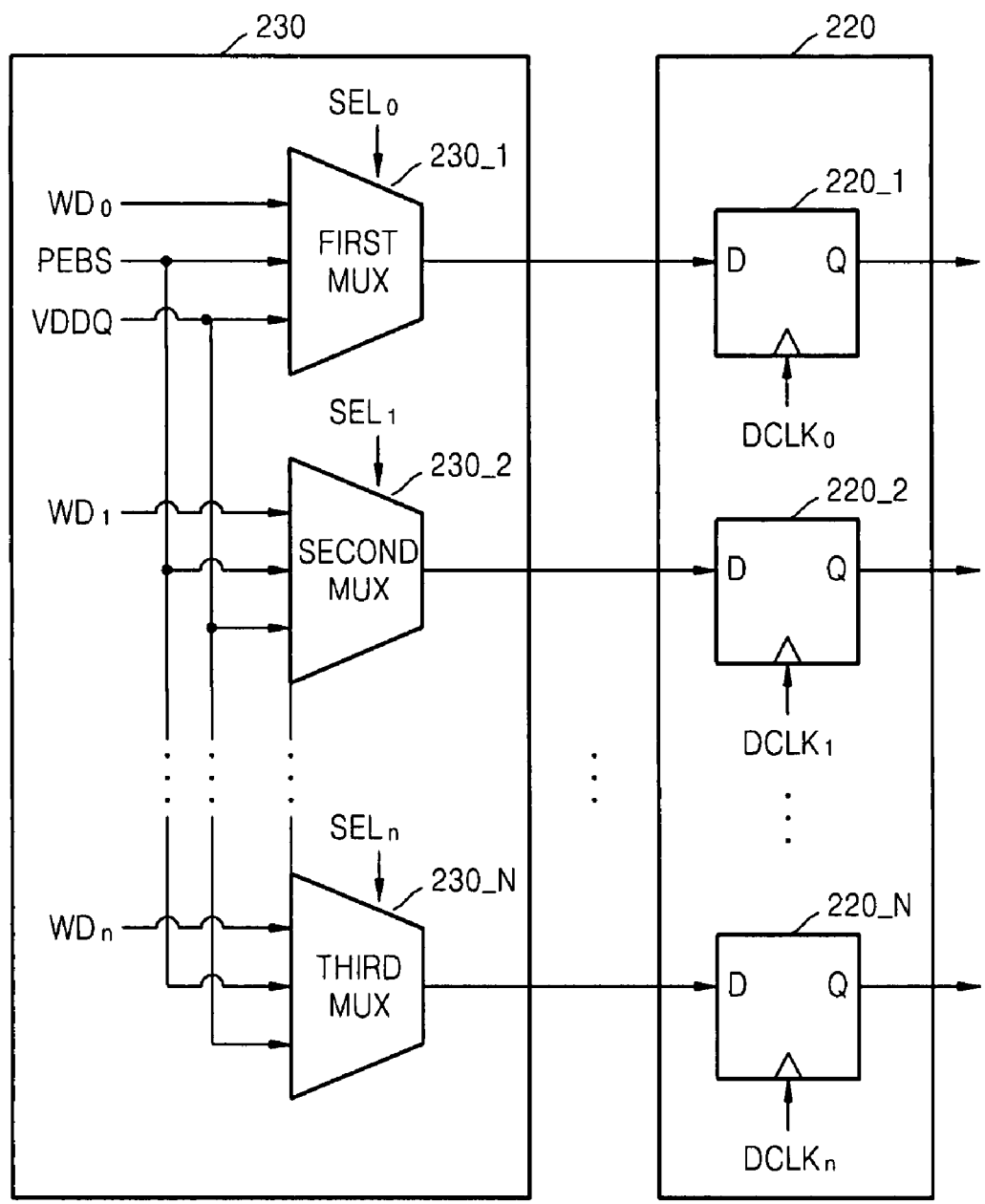
FIG. 9 is a diagram illustrating a multiplexer and a data delayer according to an example embodiment.

FIG. 9 is a diagram illustrating the multiplexer 230 and the data delayer 220 of FIG. 8 according to an example embodiment.

In the example embodiment of FIG. 9, the multiplexer 230 may include a first MUX 230_1 through an Nth MUX 230_N. The data delayer 220 may include a first flip flop 220_1 through an Nth flip flop 220_N. The first MUX 230_1 may receive a first record data $WD_0$, an AC data pattern PRBS, and a DC data pattern VDDQ, and may output one of the first record data $WD_0$, the AC data pattern PRBS, and the DC data pattern VDDQ to the data delayer 220 in response to a first selection signal $SEL_0$. Similarly, the Nth MUX 230_N may output one of the first record data $WD_0$, the AC data pattern PRBS, and the DC data pattern VDDQ to the data delayer 220 in response to an Nth selection signal $SEL_n$.

In the example embodiment of FIG. 9, the first flip flop 220_1 may temporarily store or buffer one of the AC data pattern PRBS and the DC data pattern VDDQ outputted from the first MUX 230_1 and may then output the stored AC data pattern PRBS or DC data pattern VDDQ in response to a delayed clock signal $DCLK_0$. Similarly, the Nth flip flop 220_N may temporarily store or buffer one of the AC data pattern PRBS and the DC data pattern VDDQ outputted from the nth MUX 230_N and may then output the stored AC data pattern PRBS or DC data pattern VDDQ in response to a delayed clock signal $DCLK_n$.

In the example embodiment of FIG. 9, if the first selection signal $SEL_0$ is a signal for selecting the AC data pattern PRBS, the second through Nth selection signals $SEL_1$ through $SEL_n$ may be signals for selecting the DC data pattern VDDQ. In other words, the AC data pattern PRBS may be applied to less than all (e.g., a given one) data pin, and the DC data pattern VDDQ may be applied to the remaining data pins in order to independently perform the data training for each data pin.

Figure 10:
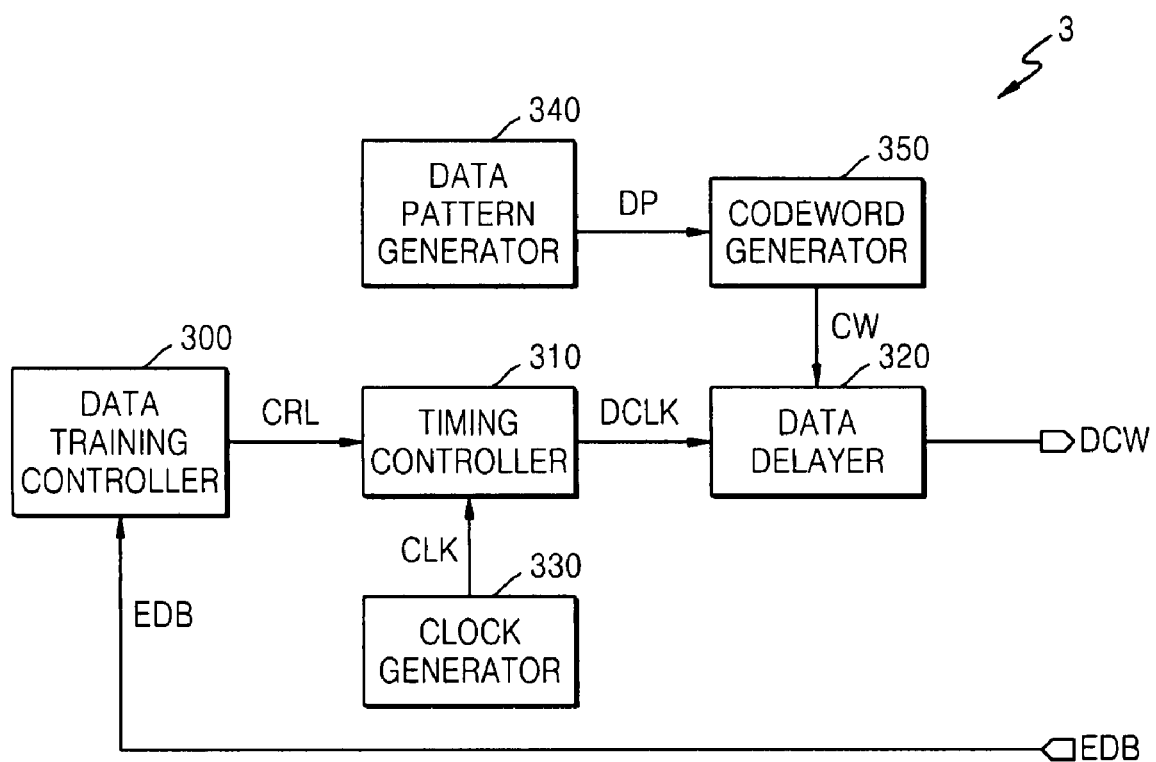
FIG. 10 is a block diagram illustrating another memory controller according to another example embodiment.

FIG. 10 is a block diagram illustrating a memory controller 3 according to another example embodiment.

In the example embodiment of FIG. 10, the memory controller 3 may include a data training controller 300, a timing controller 310, a data delayer 320, a clock generator 330, a data pattern generator 340 and a codeword generator 350. Also, the memory controller 3 may further include the multiplexer 230 and the error occurrence frequency detector 250 illustrated in FIG. 8.

In the example embodiment of FIG. 10, the data training controller 300 may generate a given control signal CRL and may output the control signal CRL to the timing controller 310. The timing controller 310 may receive the control signal CRL and a clock signal CLK and may generate a delayed clock signal DCLK in response to the control signal CRL. In an example, the clock generator 330 for generating the clock signal CRL may be a phase locked loop (PLL).

In the example embodiment of FIG. 10, the codeword generator 350 may receive a given data pattern DP from the data pattern generator 340 and may generate a codeword CW by applying a CRC code to the data pattern DP. An example process for generating the codeword CW has been described above, and will not be described further for the sake of brevity. In an example, the data pattern DP may be either an AC data pattern or a DC data pattern.

In the example embodiment of FIG. 10, the data delayer 320 may receive the codeword CW and a delayed clock signal DCLK and may generate a delayed codeword DCW by outputting the codeword CW after synchronizing the codeword CW with the delayed clock signal DCLK. The delayed codeword DCW may be transmitted to a memory device (not shown) through a data pin (not shown). The memory device may receive a transmitted delayed codeword TDCW transmitted from the memory controller 3 and may transmit the transmitted delayed codeword TDCW to an error detection circuit (not shown) included inside the memory device.

In the example embodiment of FIG. 10, the error detection circuit may generate a syndrome from the transmitted delayed codeword TDCW. The syndrome has been described above, and will not be described further for the sake of brevity. An error detection bit EDB, which indicates whether an error has occurred, may be generated based on the syndrome. In an example, the error detection bit EDB may be a single bit.

In the example embodiment of FIG. 10, the error detection circuit may transmit the generated error detection bit EDB to the memory controller 3. For example, the generator error detection bit EDB may be transmitted to the data training controller 300. The data training controller 300 may determine the error occurrence based on the transmitted error detection bit EDB. If an error is determined to have occurred, the data training controller 300 may store a delay time t_err indicating when the error occurred.

In the example embodiment of FIG. 10, the data training controller 300 may increment or increase a unit delay of the delayed codeword DCW iteratively until a given threshold set time t_set is reached. For each increment iteration, the error occurrence may be determined. If the delay time reaches the threshold set time t_set, the data training controller 300 may stop generating the control signal CRL and may determine a delay time t_opt based on the stored delay time t_err.

Figure 11:
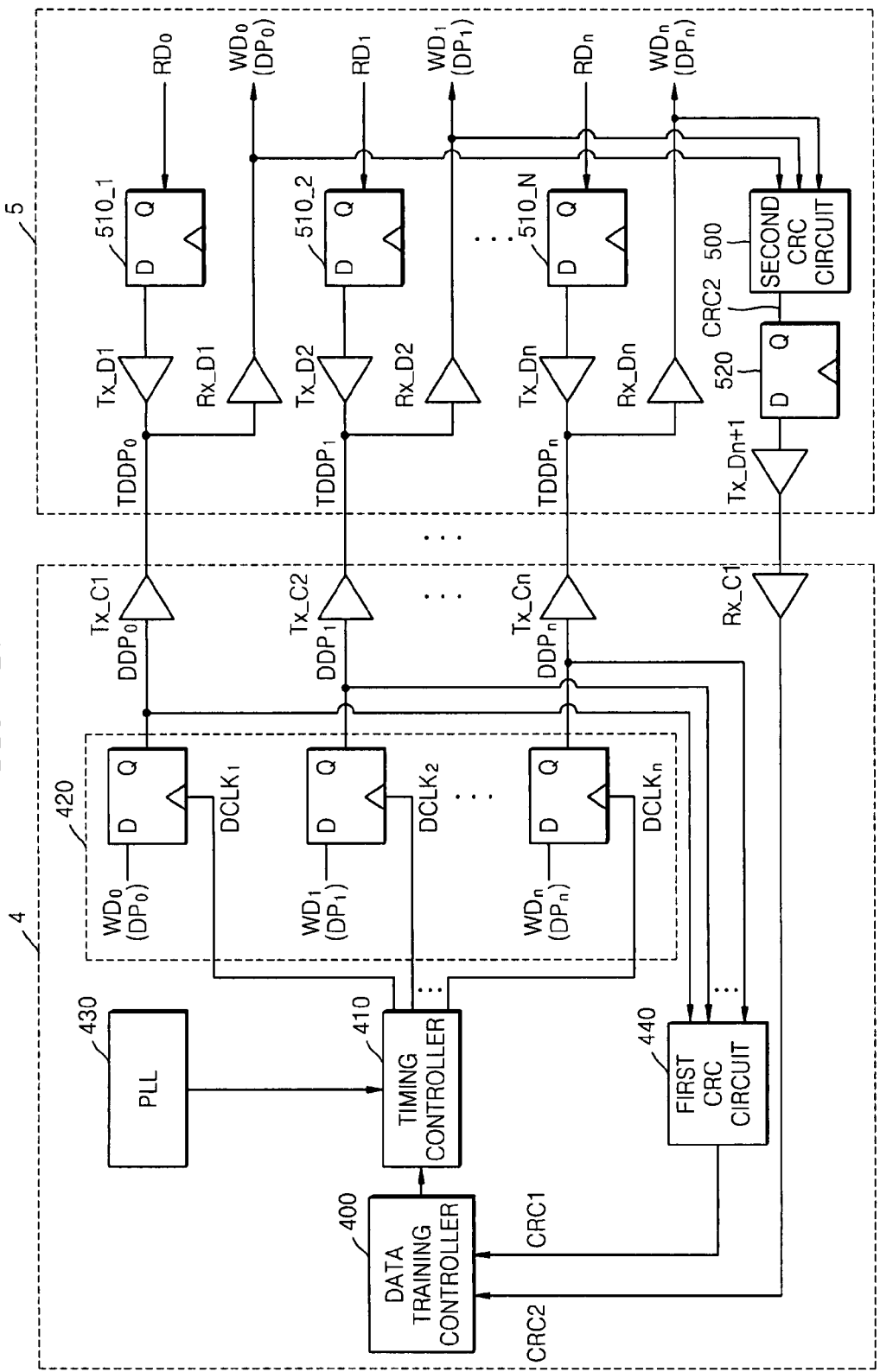
FIG. 11 is a block diagram illustrating a system according to an example embodiment.

FIG. 11 is a block diagram illustrating a system according to an example embodiment.

In the example embodiment of FIG. 11, the system may include a memory controller 4 and a memory device 5. The memory controller 4 may include a data training controller 400, a timing controller 410, a data delayer 420, a PLL 430, a first CRC circuit 440, a plurality of output buffers Tx_C1 though Tx_Cn, and a second CRC code input buffer Rx_C1. Also, the memory controller 4 may further include a plurality of input buffers (not shown). The memory device 5 may include a plurality of input buffers Rx_D1 through Rx_Dn, a second CRC circuit 500, and a second CRC code output buffer Tx_Dn+1. Also, the memory device 5 may further include a plurality of output buffers Tx_D1 through Tx_Dn.

In the example embodiment of FIG. 11, in a data record mode, the data delayer 420 may output record data WD0 through WDn, and the outputted record data WD0 through WDn may be transmitted to the memory device 5 via the output buffers Tx_C1 though Tx_Cn. The transmitted record data WD0 through WDn may be transmitted to a memory cell array (not shown) via each of the input buffers Rx_D1 through Rx_Dn.

In the example embodiment of FIG. 11, in a data read mode, read data RD0 through RDn outputted from the memory cell array may be temporarily stored or buffered in flip flops 510_1, 510_2, and 510_N and transmitted to the memory controller via the output buffers Tx_D1 through Tx_Dn. In a data training mode, the data delayer 420 may output given data patterns DP0 through DPn after synchronizing the data patterns DP0 through DPn with a delayed clock signal DCLK, and delayed data patterns DDP0 through DDPn outputted from the data delayer 420 may be transmitted to the memory device 5 via the output buffers Tx_C1 through Tx_Cn.

In the example embodiment of FIG. 11, before being transmitted to the memory device 5, the delayed data pattern DDP0 through DDPn may be inputted to the first CRC circuit 440. The first CRC circuit 440 may generate a first CRC code from the delayed data patterns DDP0 through DDPn and may output the generated first CRC code to the data training controller 400. The transmitted data patterns TDDP0 through TDDPn transmitted to the memory device 5 may be outputted to the second CRC circuit 500 via the input buffers Rx_D1 through Rx_Dn. The second CRC circuit 500 may generate a second CRC code from the transmitted data patterns TDDP0 through TTDPn.

In the example embodiment of FIG. 11, the generated second CRC code may be temporarily stored in a flip flop 514, and then transmitted to the memory controller 4 via the second CRC code output buffer Tx_Dn+1. The memory controller 4 may receive the generated second CRC code via the second CRC code input buffer Rx_C1 and may transmit the second CRC code to the data training controller 400.

In the example embodiment of FIG. 11, the data training controller may receive the first CRC code and the second CRC code and may compare whether the first and second CRC codes are the same. Based on the result of the comparison, the data training controller 400 may determine a data delay time for reducing skew (e.g., for each respective data pin).

In the example embodiment of FIG. 11, in the data training mode, a data pattern received via the input buffers Rx_D1 through Rx_Dn need not be stored in a memory cell (not shown) included inside the memory device 5. Accordingly, the data training may be performed without reading data from the memory cell.

Figure 12:
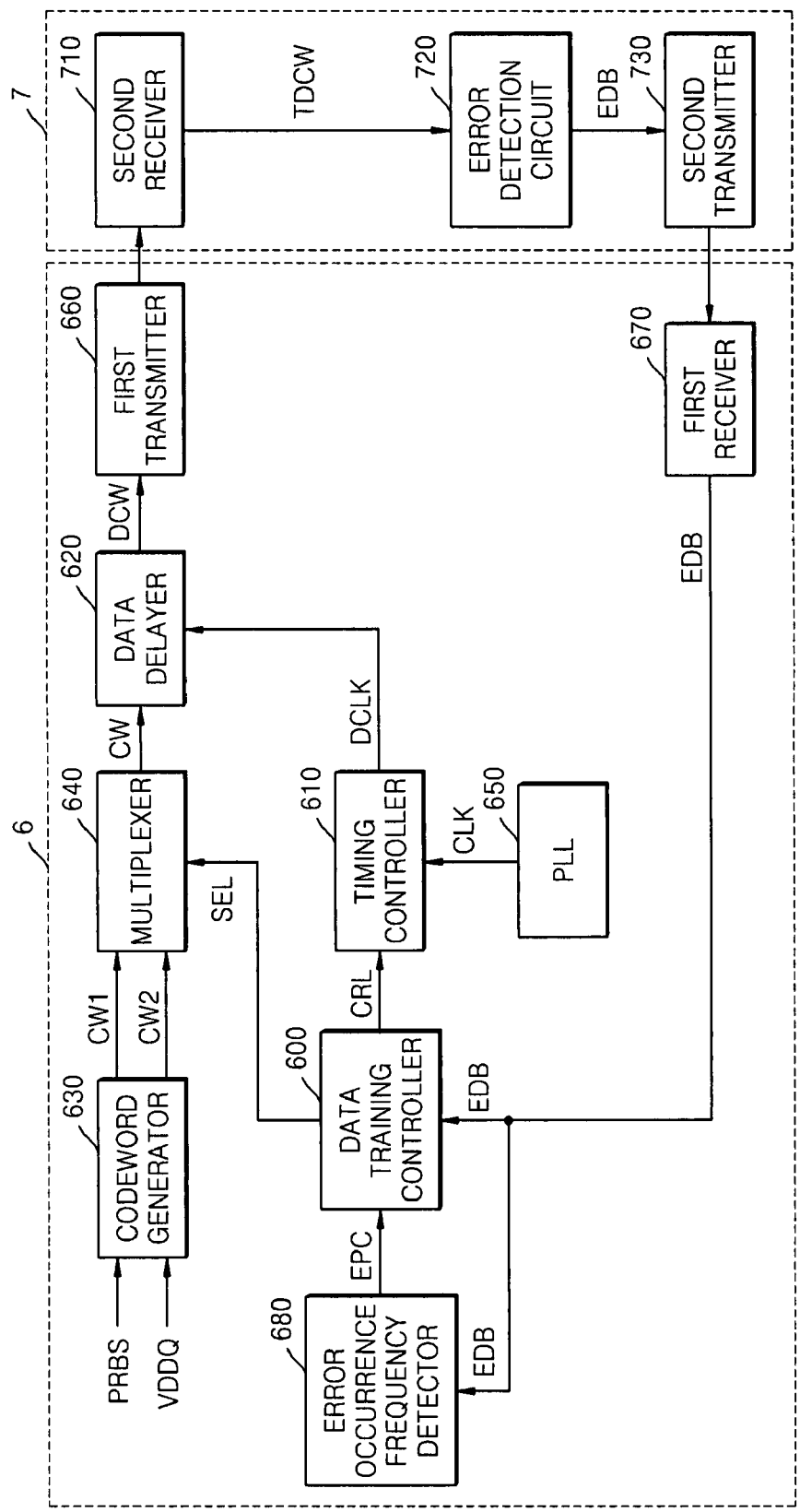
FIG. 12 is a block diagram illustrating another system according to another example embodiment.

FIG. 12 is a block diagram illustrating a system according to another example embodiment.

In the example embodiment of FIG. 12, the system may include a memory controller 6 and a memory device 7. The memory controller 6 may include a data training controller 600, a timing controller 610, a data delayer 620, a codeword generator 630, a multiplexer 640, a PPL 650, a first transmitter 660, a first receiver 670, and an error occurrence frequency detector 680. The memory device 7 may include a second receiver 710, an error detection circuit 720, and a second transmitter 730. The codeword generator 630 may receive an AC data pattern PRBS and a DC data pattern VDDQ and may generate a first codeword CW1 and a second codeword CW2 by adding an error detection code to the AC data pattern PRBS and the DC data pattern VDDQ. In an example, the error detection code may be a CRC code.

In the example embodiment of FIG. 12, the multiplexer 640 may receive the first codeword CW1 and the second codeword CW2, and may output one of the first codeword CW1 and the second codeword CW2 in response to a selection signal SEL outputted from the data training controller 600. The data training controller 600 may output a given control signal CRL, for regulating the delay time of a codeword CW. The timing controller 610 may receive a clock signal CLK from the PLL 650 and may output a delayed clock signal DCLK in response to the control signal CRL.

In the example embodiment of FIG. 12, the data delayer 620 may receive the codeword CW and a delayed clock signal DCKL and may output the codeword CW after delaying the codeword CW for a given amount of time. The first transmitter 660 may transmit a delayed codeword DCW outputted from the data delayer 620 to the memory device 7 via a data pin (not shown). The second receiver 710 may output the transmitted codeword TDCW to the error detection circuit 720.

In the example embodiment of FIG. 12, the error detection circuit 720 may detect an error occurrence in the transmitted delayed codeword TDCW. For example, if an error has occurred, the error detection bit EDB may be outputted at the first logic level (e.g., a higher logic level or logic "1") and if an error has not occurred, the error detection bit EDB may be outputted at the second logic level (e.g., a lower logic level or logic "0"). The error detection bit EDB may be transmitted to the memory controller 6 via the second transmitter 730.

In the example embodiment of FIG. 12, the first receiver 670 may receive the error detection bit EDB and may output the error detection bit EDB to the data training controller 600 and the error occurrence frequency detector 680. The data training controller 600 may determine an error occurrence time using the error detection bit EDB, and may determine a given data delay time (e.g., sufficient to reduce skew) based on the determined error occurrence time.

In the example embodiment of FIG. 12, the error occurrence frequency detector 680 may receive the error detection bit EDB, may detect the error occurrence frequency, and may output a control signal EPC, for regulating a cycle of the data training performance based on the error occurrence frequency, to the data training controller 600.

In another example embodiment, data training processes and/or systems may be adapted so as to perform data training without having a separate resistor even if data is stored within a memory cell. Also, because data need not be recorded into a memory cell, data need not be separately read from the memory cell in order to perform data training, such that a data training time may be reduced.

Example embodiments being thus described, it will be obvious that the same may be varied in many ways. For example, it is understood that the above-described first and second logic levels may correspond to a higher level and a lower logic level, respectively, in an example embodiment. Alternatively, the first and second logic levels/states may correspond to the lower logic level and the higher logic level, respectively, in other example embodiments.

Such variations are not to be regarded as a departure from the spirit and scope of example embodiments, and all such modifications as would be obvious to one skilled in the art are intended to be included within the scope of the following claims.

What is claimed is:

1. A method of training data, comprising:
    transmitting a given data pattern to a memory device;
    first determining whether an error is present within the transmitted data pattern based on at least one error detection code, the at least one error detection code based on at least one of the given data pattern and the transmitted data pattern; and
    second determining a data delay time for reducing an amount of skew based on whether the first determining step determines an error to be present within the transmitted data pattern,
    wherein the second determining step determines the data delay time based on a time when the first determining step determines an error to be present.

2. The method of claim 1, further comprising:
    generating a first error detection code based on the given data pattern;
    generating a second error detection code based on the transmitted data pattern,
    wherein the first determining step determines whether an error is present based on the first error detection code and the second error detection code.

3. The method of claim 1, further comprising:
    delaying the given data pattern for a given amount of time; and
    repeating the transmitting, first determining and second determining steps for a different data pin.

4. The method of claim 3, wherein each iteration of the delaying step delays the given data pattern by 1/N of a clock cycle of an internal clock signal of the memory device, wherein N is a positive integer.

5. The method of claim 3, wherein the first generated error code is generated at a memory controller.

6. The method of claim 1, wherein the transmitting step includes:
 transmitting an alternating current (AC) data pattern via a given data transmission line; and
 transmitting a direct current (DC) data pattern via at least one data transmission line other than the given data transmission line.

7. The method of, claim 6, wherein the DC data pattern maintains one of a first and second logic level.

8. The method of claim 1, wherein the at least one error detection code is a cyclic redundancy check (CRC) code.

9. The method of claim 1, further comprising:
 calculating an error occurrence frequency based on the first determining step; and
 adjusting a cycle of data training performance based on the calculated error occurrence frequency.

10. The method of claim 9, wherein the adjusting step includes:
 decreasing a time period allocated to data training if the calculated error occurrence frequency is equal to or greater than a threshold value; and
 increasing the time period allocated to data training if the calculated error occurrence frequency is below the threshold value.

11. The method of claim 1, wherein the transmitted data pattern is not stored in a memory cell of the memory device.

12. The Method of claim 1, further comprising:
 generating an error detection bit indicating whether the first determining step determines an error to be present;
 transmitting the error detection bit to a memory controller, and
 wherein the transmitted data pattern includes the at least one error detection code.

13. The method of claim 12, further comprising:
 delaying the given data pattern including the at least one error correction code for a given amount of time; and
 repeating the transmitting, first determining and second determining steps for a different data pin.

14. The method of claim 12, wherein the first determining step determines whether an error is present based on a cyclic redundancy check (CRC) code.

15. The method of claim 12, further comprising:
 calculating an error occurrence frequency based on the first determining step; and
 adjusting a cycle of data training performance based on the calculated error occurrence frequency.

16. The method of claim 12, wherein the transmitted data pattern is not stored in a memory cell of the memory device.

17. A data training system, comprising:
 a memory controller transmitting a given data pattern to a memory device, the memory controller first determining whether an error is present within the transmitted data pattern based on at least one error detection code, the at least one error detection code based on at least one of the given data pattern and the transmitted data pattern and second determining a data delay time for reducing an amount of skew based on whether the first determining step determines an error to be present within the transmitted data pattern,
 wherein the second determining step determines the data delay time based on a time when the first determining step determines an error to be present.

18. The system of claim 17, wherein the memory controller generates a first error detection code based on the given data pattern, the memory device receives the transmitted data pattern, generates a second error detection code based on the transmitted data pattern and transmits the second error detection code to the memory controller, the memory controller first determining whether an error is present based on a comparison between the first and second error detection codes.

19. The system of claim 18, wherein the first and second error detection codes are cyclic redundancy check (CRC) codes.

20. The system of claim 18, the memory controller includes:
 a data training controller which generates a control signal for controlling a delay time of the given data pattern, and performing the first and second determining steps;
 a timing controller which generates a delayed clock signal by delaying a clock signal for a given amount of time in response to the control signal;
 a data delayer which generates a delayed data pattern by synchronizing the given data pattern with the delayed clock signal and then outputting the data pattern; and
 a first error detection code generator which generates the first error detection code based on the delayed data pattern.

21. The system of claim 20, wherein the memory controller further includes an error occurrence frequency calculator which calculates an error occurrence frequency based on the first determining step, and the data training controller adjusts an amount of time allocated to data training based on the calculated error occurrence frequency.

22. The system of claim 17, wherein the memory controller transmits an alternating current (AC) data pattern via a given data transmission line and transmits a direct current (DC) data pattern via at least one data transmission line other than the given data transmission line.

23. The system of claim 22, wherein the memory controller includes a multiplexer which selectively outputs the AC data pattern or the DC data pattern in response to a selection signal outputted from a data training controller.

24. The system of claim 17, wherein the transmitted data pattern is not stored in a memory cell of the memory device.

25. The system of claim 17, wherein the transmitted data pattern includes the at least one error detection code, and the memory device generates an error detection bit indicating whether an error is present and transmits the error detection bit to the memory controller, the memory controller performing the first determining step based on the transmitted error detection bit.

26. The system of claim 25, wherein the at least one error detection code is a cyclic redundancy check (CRC) code.

27. The system of claim 25, wherein the memory controller includes:
 a code word generator which generates the given data pattern including the error detection code;
 a data training controller which generates a control signal for controlling a delay time of the data pattern and performs the second determining step based on the error detection bit;
 a timing controller which generates a delayed clock signal by delaying a clock signal for a given amount of time in response to the control signal; and a data delayer which generates a delayed data pattern by synchronizing the given data pattern with the delayed clock signal and then outputting the given data pattern.

28. The system of claim 25, wherein the memory controller further includes an error occurrence frequency calculator which calculates an error occurrence frequency based on the first determining step, and the data training controller adjusts an amount of time allocated to data training based on the calculated error occurrence frequency.

* * * * *